(12) United States Patent
Dally

(10) Patent No.: US 7,627,069 B2
(45) Date of Patent: Dec. 1, 2009

(54) DIGITAL TRANSMIT PHASE TRIMMING

(75) Inventor: William J. Dally, Stanford, CA (US)

(73) Assignee: Rambus Inc., Los Altos, CA (US)

( * ) Notice: Subject to any disclaimer, the term of this patent is extended or adjusted under 35 U.S.C. 154(b) by 747 days.

(21) Appl. No.: 11/046,451

(22) Filed: Jan. 27, 2005

(65) Prior Publication Data

US 2006/0165205 A1 Jul. 27, 2006

(51) Int. Cl.
*H04L 7/00* (2006.01)
(52) U.S. Cl. .................... 375/371; 375/376
(58) Field of Classification Search .......... 375/355, 375/371, 376
See application file for complete search history.

(56) References Cited

U.S. PATENT DOCUMENTS

| | | | |
|---|---|---|---|
| 3,654,394 A | 4/1972 | Gordon | 179/15 BL |
| 4,390,988 A | 6/1983 | Best et al. | 370/113 |
| 5,075,566 A | 12/1991 | Chuang et al. | 307/243 |
| 5,808,571 A | 9/1998 | Kuwata et al. | 341/100 |
| 5,850,422 A * | 12/1998 | Chen | 375/371 |
| 6,211,714 B1 | 4/2001 | Jeong | 327/293 |
| 6,570,944 B2 * | 5/2003 | Best et al. | 375/355 |
| 6,674,772 B1 | 1/2004 | Dally et al. | 370/539 |
| 6,677,793 B1 | 1/2004 | Chan et al. | 327/158 |
| 7,149,269 B2 * | 12/2006 | Cranford et al. | 375/373 |
| 2004/0150453 A1 | 8/2004 | Farjad-rad | 327/307 |
| 2005/0108600 A1 * | 5/2005 | Arguelles | 714/701 |
| 2006/0045224 A1 * | 3/2006 | Cranford et al. | 375/355 |

OTHER PUBLICATIONS

International Search Report for International Application No. PCT/US2006/001592, mailed Feb. 23, 2007.
Lee, M.E., et al., "Low-Power Area-Efficient High-Speed I/0 Circuit Techniques," IEEE J. of Solid-State Circuits, vol. 35, No. 11, Nov. 2000, pp. 1591-1599.
Wang, Y.M., et al., "A Low-Power Half-Delay-Line Fast Skew-Compensation Circuit," IEEE J. of Solid-State Circuits, vol. 39, No. 6, Jun. 2004, pp. 906-918.
Van De Beek, R.C.H., et al., "Low-Jitter Clock Multiplication: A Comparison Between PLLs and DLLs," IEE Transactions on Circuits and Systems-II: Analog and Digital Signal Processing, vol. 49, No. 8, Aug. 2002, pp. 555-556.
Weinlader, D.K., "Precision CMOS Receivers for VLSI Testing Applications," Doctoral Dissertation, Stanford University, Nov. 2001.

* cited by examiner

*Primary Examiner*—Emmanuel Bayard
(74) *Attorney, Agent, or Firm*—Morgan, Lewis & Bockius LLP

(57) ABSTRACT

A circuit has a phase adjustment circuit to generate an adjusted clock signal by adjusting a first clock signal in accordance with a control signal. A multiplexer receives input data signals on a plurality of first data lines and outputs onto at least one second data line output data signals in accordance with a plurality of second clock signals. A timing measurement circuit determines at least one timing parameter of at least one output data signal on at least the one second data line and generates the control signal in accordance with a deviation of at least the one timing parameter from a desired value.

25 Claims, 13 Drawing Sheets

US 7,627,069 B2

DIGITAL TRANSMIT PHASE TRIMMING

BRIEF DESCRIPTION OF THE INVENTION

The present invention relates generally to the transmission of data. More specifically, the present invention relates to the correction of jitter in the transmission of data by phase trimming.

BACKGROUND OF THE INVENTION

A high-speed data transmission circuit typically multiplexes several lower-speed signals together to generate output data signals at an output bit rate. An existing data transmission circuit 100 is shown in FIG. 1. A multi-phase clock generator 112 generates clock signals 114. The clock signals 114 have equal phase spacing from one another and each has a frequency that is quarter of the output bit rate. The clock signals 114 are used to drive a multiplexer 116 to couple one of the input data signals 110, having a bit rate that is one quarter of the output bit rate, onto an output 126 and thereby generate output data signals having the output bit rate. Each input data signal 110 is driven onto output 126, in turn, as the clock signals 114 cycle through their respective phases. For example, driver 120a and its associated AND gate 118a drive input data signal d0 110a onto multiplexer output m0 122 when clock signal phi0 114a is a logical true and clock signal phi1 114b is a logical false. Drivers 120b, 120c and 120d perform a similar function for input data signals d1 110b, d2 110c and d3 110d based on the clock signals 114. The multiplexer output m0 122 is amplified by output transmission driver 124 to generate the output data signals on the output 126.

In the data transmission circuit 100, and in high-speed data transmission circuits in general, mismatches in components and wiring may lead to an imbalance between the phases of the clock signals 114. These mismatches include mismatches in the clock generator 112, which result in the clock signals 114 not having equal phase spacing, mismatches in drivers and wiring used for distributing the clock signals 114, and mismatches in the multiplexer 116. The mismatches give rise to timing variations. The timing variations, in turn, may result in an output data signal having one or more bit cells that are too long or too short in duration. Such variations in one or more bits in the output data signals are a source of deterministic jitter and degrade timing margins for a link between the data transmission circuit 100 and a corresponding receiver. There is a need, therefore, for an improved data transmission circuit in order to reduce deterministic jitter in output data signals.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE PREFERRED EMBODIMENTS

In an embodiment of a circuit, one or more phase adjustment circuits generates an adjusted clock signal by adjusting a first clock signal in accordance with a control signal. A multiplexer receives input data signals on a plurality of first data lines and outputs onto at least one second data line output data signals in accordance with a plurality of second clock signals. The second clock signals include the adjusted clock signal. A timing measurement circuit determines at least one timing parameter of at least one output data signal on at least the one second data line and generates the control signal in accordance with a deviation of at least the one timing parameter from a desired value.

The data transmission circuit may include at least one output transmission driver circuit coupled to the multiplexer. At least the one transmission driver circuit generates output data signals on at least the one second data line.

In some embodiments, the timing measurement circuit includes an analog measurement circuit. In some embodiments, the timing measurement circuit includes a digital measurement circuit.

In some embodiments, the data transmission circuit has a mode of operation in which at least the one timing parameter of at least the one output data signal is determined using input data signals corresponding to at least one training sequence. In other embodiments, at least the one timing parameter of at least the one output data signal is determined during a normal mode of operation. In some embodiments, at least the one timing parameter of at least the one output data signal is determined continuously during operation of the circuit. The timing parameter may be a leading edge time and/or a trailing edge time, or it may be an output data signal duration.

In some embodiments, there may be a first phase adjustment circuit and a second phase adjustment circuit in the circuit. The first phase adjustment circuit adjusts a first edge time of at least the one output data signal and the second phase adjustment circuit adjusts a second edge time of at least the one output data signal. In some embodiments, the first edge time and the second edge time may be a leading edge time and/or a trailing edge time. In some embodiments, the first edge time and the second edge time may be a rising edge time and/or a falling edge time.

Reference will now be made in detail to embodiments, examples of which are illustrated in the accompanying drawings. In the following detailed description, numerous specific details are set forth in order to provide a thorough understanding of the present invention. However, it will be apparent to one of ordinary skill in the art that the present invention may be practiced without these specific details. In other instances, well-known methods, procedures, components, and circuits have not been described in detail so as not to unnecessarily obscure aspects of the embodiments.

Figure 1:
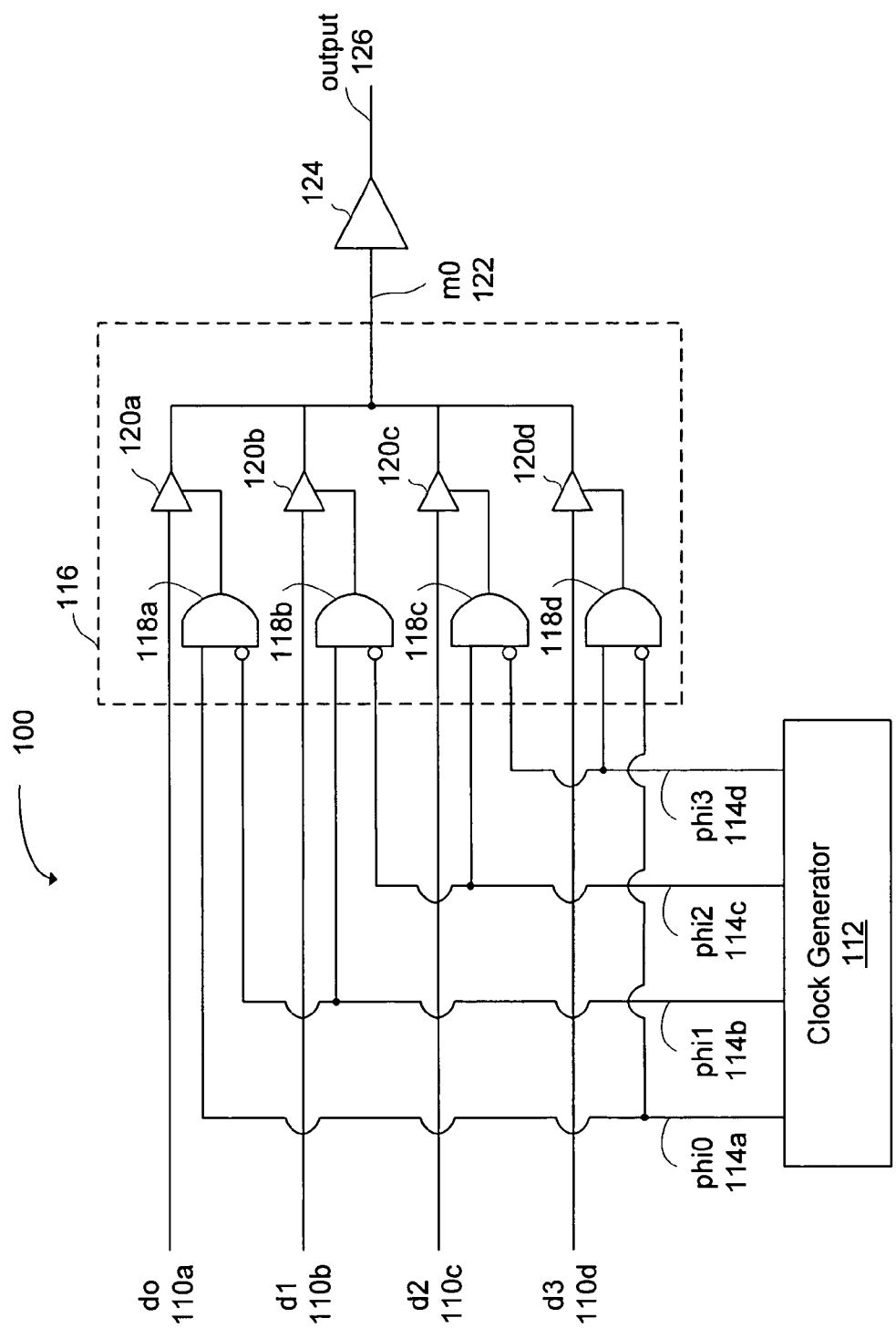
FIG. 1 is a block diagram illustrating an existing data transmission circuit.
Figure 2A:
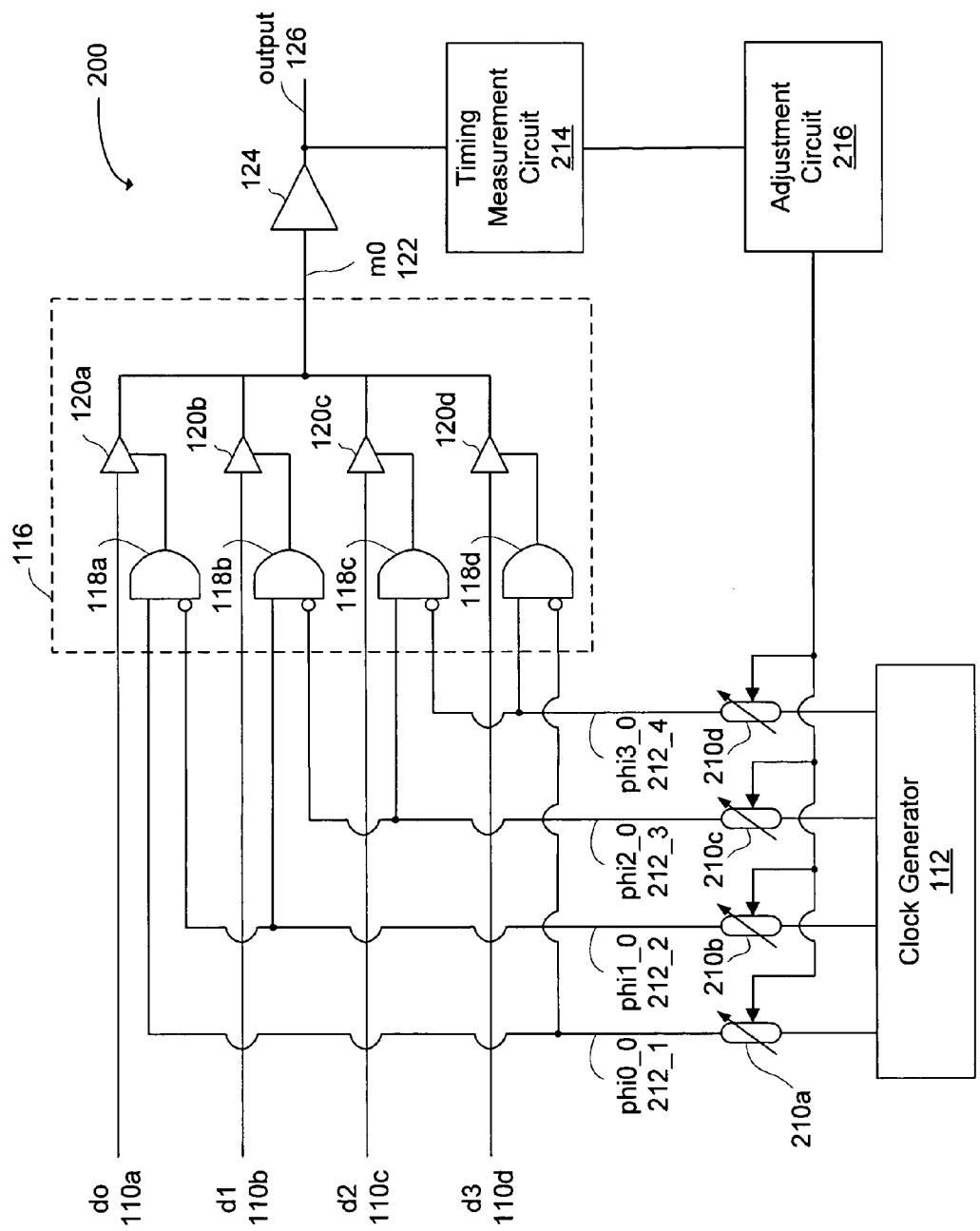
FIG. 2a is a block diagram illustrating a data transmission circuit.

FIG. 2a illustrates an embodiment of the data transmission circuit 200 with digital transmit phase trimming that allows reduction of mismatches and corresponding deterministic jitter in one or more output data signals on the output 126. A timing measurement circuit 214 measures a timing parameter, such as at least one pulse duration or edge time, of the one or more output data signals or bits. In some embodiments, at least the one timing parameter includes a leading edge time and/or a trailing edge time. In some embodiments, at least the one timing parameter includes a rising edge time and/or a falling edge time. In some embodiments, at least the one timing parameter includes a rising or a falling pulse duration. The timing measurement circuit 214 may measure at least the one timing parameter, such as the leading edge time and the trailing edge time of a respective output data signal in order to determine a duration of the respective output data signal.

An adjustment circuit 216 may include control logic to determine a deviation from a desired value, such as an edge time, using at least the one timing parameter measured with the timing measurement circuit 214. In some embodiments, the adjustment circuit 216 may include control logic to determine a deviation from a desired duration using the duration measured with the timing measurement circuit 214. Based on the deviation from the desired value of at least the one timing parameter, such as the edge time, and/or the desired duration, the adjustment circuit 216 generates one or more control signals 217 to adjust a phase of one or more of the first clock signals generated by the clock generator 112 using phase adjustment circuits 210 to produce second clock signals 212. The modified second clock signals 212 gate the multiplexer 116 such that the respective output data signal is adjusted to reduce the deviation. In this way, the data transmission circuit 200 may reduce mismatches and corresponding deterministic jitter in the one or more output data signals.

In some embodiments, the adjustment circuit 216 may be implemented as a finite-state-machine or as a microprocessor with an adjustment process implemented in firmware. In some embodiments, the phase adjustment circuits 210 may be incorporated in the clock generator 112.

While FIG. 2a shows four clock signals 212 and four input data signals 110, in some embodiments there may be two or more clock signals and/or two or more data signals. In addition, the output 126 may be on one or more output data lines. In some embodiments, the output 126 may be single-ended. In other embodiments, the output 126 may be differential. In still other embodiments with a plurality of output data lines, some of the output data lines may be single-ended and some of the output data lines may be differential.

In some embodiments, the phase adjustment circuits 210 are phase locked loops, delay locked loops, analog delay lines and/or digital delay lines. In those embodiments in which one or more of the phase adjustment circuits 210 includes a digital delay line, the data transmission circuit 200 may also include one or more storage registers (not shown) for storing one or more phase settings, output by the adjustment circuit 216, that are used to adjust one or more of the phase adjustment circuits 210.

In some embodiments, the clock generator 112 may have a single oscillator. In other embodiments, the clock generator 112 may have two or more oscillators. The clock signals 212 may be generated from one or more oscillators using one or more ring oscillators, one or more delay locked loops and/or one or more additional timing circuits. All of these timing circuits may be implemented using static CMOS circuits, current-starved inverters, source-coupled FET logic (SCFL) and/or current-mode logic (CML).

In some embodiments, the timing measurement circuit 214 includes an analog measurement circuit, while in other embodiments the timing measurement circuit 214 includes a digital measurement circuit. In some embodiments, the output data signals are digital.

The timing measurements performed by the timing measurement circuit 214 may be performed, in other embodiments, at other locations in the data transmission circuit 200 than at the output 126. For example, the measurement may be performed at the multiplexer output m0 122, on one or more of the clock signals 212 (between outputs of the phase adjustment circuits 210 and the multiplexer 116) and/or on one or more internal nodes of the drivers 120 in the multiplexer 116.

Figure 3A:
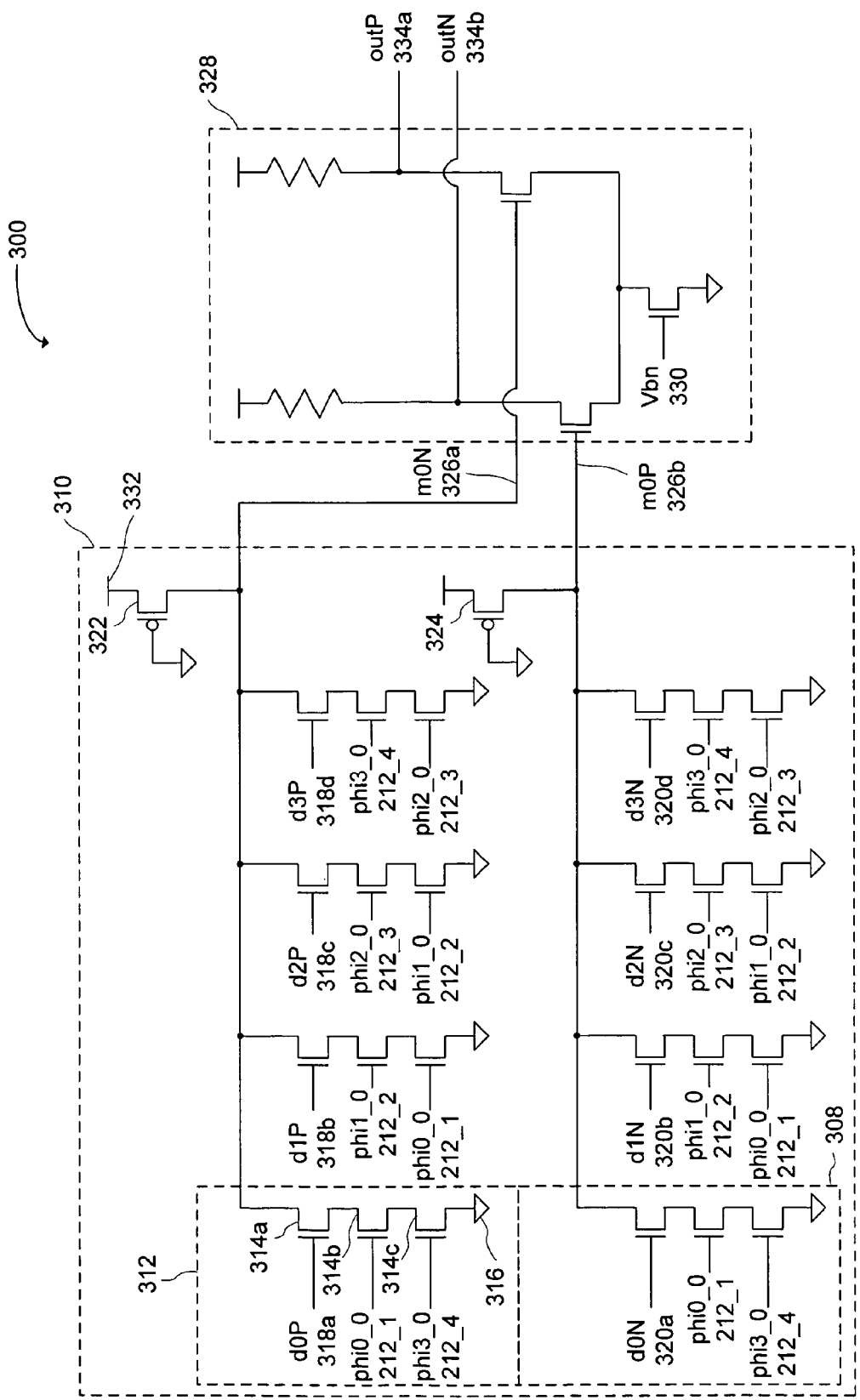
FIG. 3a is a block diagram illustrating a data transmission circuit.

FIG. 3a illustrates an embodiment of data transmission circuit 300. Data transmission circuit 300 implements the multiplexer 116 (FIG. 2a) and the transmission driver 124 (FIG. 2a) of data transmission circuit 200 (FIG. 2a). The data transmission circuit 300 includes a differential pseudo-NMOS multiplexer 310 and a differential CML amplifier 328 generating differential output 334. Drivers 120 and their associated AND gates 118 (FIG. 2a), such as driver 120a and gate 118a (FIG. 2a), are each implemented as two groups of three series-connected NFETs, such as NFETs 314 in group 312. The NFETs 314 are driven by positive input data signal d0P 318a, clock signal phi0_0 212_1 and clock signal phi3_0 212_4, respectively.

Another group 308 of three NFETs are driven by negative input data signal d0N 320a, the clock signal phi0_0 212_1 and the clock signal phi3_0 212_4, respectively. The first group 312 and the second group 308 have the same clock signals 212 as inputs and, therefore, correspond to a column in the multiplexer 310. The remaining three columns each have two groups of three NFETs, including one group for a positive input data signal 318 and another group for a corresponding negative data input signal 320. In addition, each column has a respective pair of clock signals 212 as inputs.

The upper and lower portions of differential multiplexer 310 operate in a complementary manner. During each clock phase one column of the multiplexer is activated and one of the two multiplexer outputs 326 is pulled low while the other output remains high depending on the polarity of one of the data input signals 318 and 320. Thus, if positive input data signal d0P 318a, clock signal phi0_0 212_1 and clock signal phi3_0 212_4 are high during a period of time, multiplexer output m0N 326a is coupled to ground 316, i.e., the multiplexer output m0N 326a is low. Otherwise, during the time period in which both clock signal phi0_0 212_1 and clock signal phi3_0 212_4 are high, pull-up load 322 couples the multiplexer output m0N 326a to a supply voltage 332, i.e., the multiplexer output m0N 326a is high. Similarly, if negative input data signal d0N 320a, clock signal phi0_0 212_1 and clock signal phi3_0 212_4 are high during the period of time, multiplexer output m0P 326b is coupled to ground 316, i.e., the multiplexer output m0P 326b is low. Otherwise, during the time period in which both clock signal phi0_0 212_1 and clock signal phi3_0 212_4 are high, pull-up load 324 couples the multiplexer output m0P 326b to a supply voltage 332, i.e., the multiplexer output m0P 326b is high.

The pull-up loads 322 and 324 are sized to keep the swing on multiplexer output 326 low and hence the bandwidth high. Differential amplifier 328 has a bias voltage Vbn 330 that controls a gain of the amplifier. The output 334 may drive a pair of 50 Ohm (Ω) transmission lines.

The multiplexer 310 in data transmission circuit 300 is implemented as a differential pseudo-NMOS circuit. In other embodiments, circuits in the data transmission circuit 300 may be implemented using single-ended and/or differential logic, as well as with static CMOS, dynamic CMOS, pseudo-NMOS, SCFL and/or CML circuits.

Figure 4:
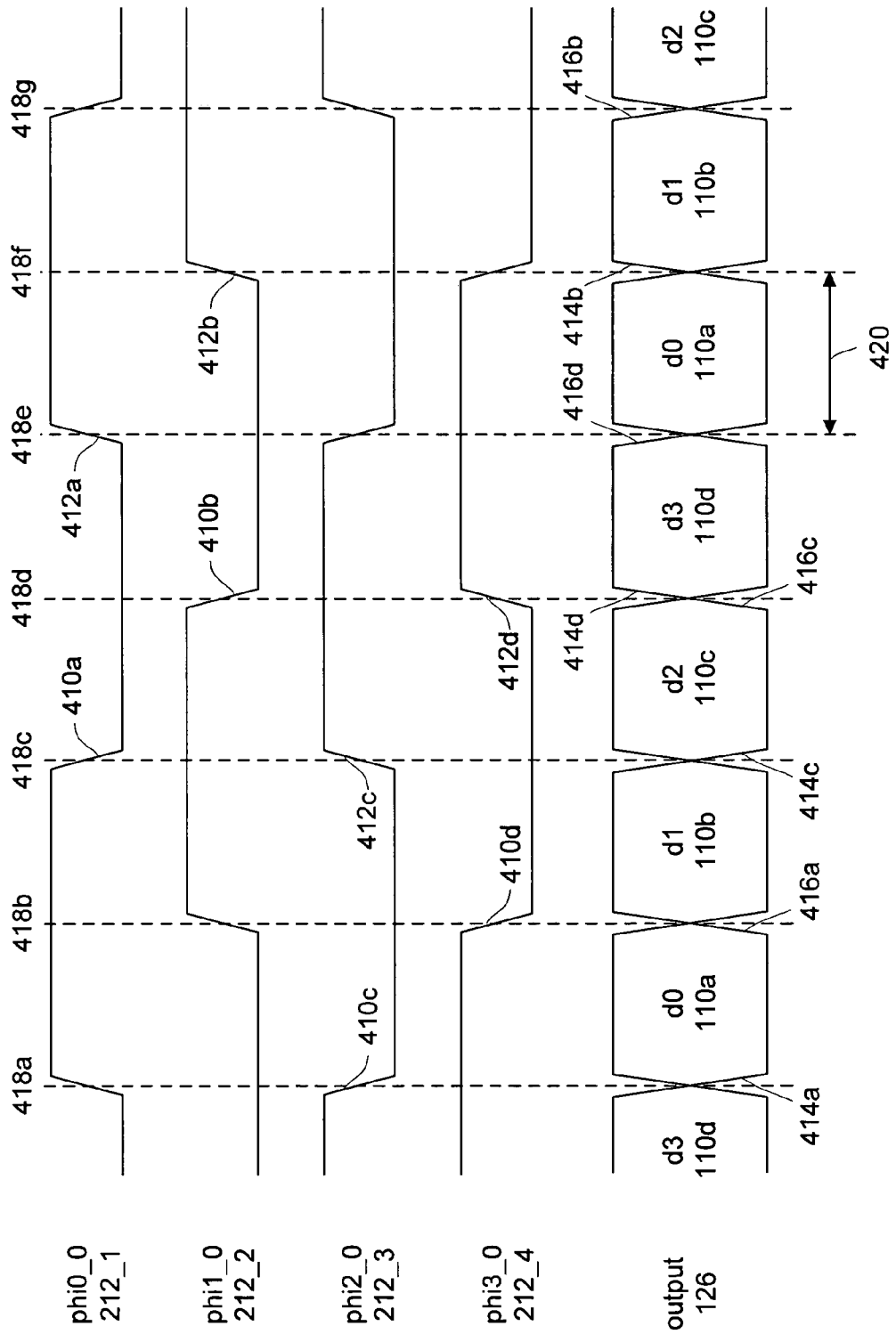
FIG. 4 is a timing diagram illustrating timing of clock signals and output data signals.

Ideally, for an embodiment with four clock signals 212, the period of time that one of the multiplexer outputs, such as multiplexer output m0N 326a, is pulled high or low by a respective column should equal one bit time, i.e., an inverse of the data rate of the output 334, and one quarter of the corresponding clock period. Timing for the data transmission circuit 300 is illustrated in FIG. 4. Clock signals 212 have falling edges 410 and rising edges 412. The falling edges 410 and the rising edges 412 define edge times 418 for output data signals on the output 126. The output data signals correspond to the input data signals 110. Note that the data rate of the output 126 is four-times the data rate of each of the input data signals 110. The edge times 418 include leading edge times 414 and trailing edge times 416 for the output data signals. Depending on whether the respective output data signal corresponds to a logical true or a logical false, the leading edge time 414 may correspond to a rising edge time or a falling edge time, and the trailing edge time 416 may correspond to a rising edge time or a falling edge time. As noted above, in this example, where the data toggles each bit time, a spacing between adjacent edge times 418 should correspond to the inverse of the data rate on the output 126, as should a duration 420 of the respective output data signal.

In practice, variations, such as a threshold voltage and/or beta of one or more of the NFETs in the multiplexer 310 (FIG. 3a), will cause a deviation from the ideal period of time. These deviations from the ideal times at which an input data signal, such as input data signal d0 110a, is output, including the leading edge time 414 and/or the trailing edge time 416, may be repeatable. Repeatable deviations constitute deterministic jitter in one or more of the output data signals on output 334. Adjustment of the phases of one or more of the clock signals 212 that control the operation of the multiplexer 310 allows reduction of mismatches in one or more phases of the clock signals 212 and the corresponding deterministic jitter. Adjustment of the phases of a pair of clocks signals, such as clock signal phi0_0 212_1 and clock signal phi3_0 212_4, also allows the duration of one or more of the output signals to be adjusted.

Suppose the duration 420 of the output data signal corresponding to input data signal d0 110a is less than the desired value of a quarter of the inverse of the data rate. This deviation may be compensated by adjusting the phase of clock signal phi0_0 212_1 and/or the phase of clock signal phi3_0 212_4, since input data signal do 110a is asserted when the clock signal phi0_0 212_1 and the clock signal phi3_0 212_4 are both high. In principle, the phase of clock signal phi0_0 212_1 could be reduced, the phase of clock signal phi3_0 212_4 could be increased or both the phase of clock signal phi0_0 212_1 and the phase of clock signal phi3_0 212_4 could be adjusted. More generally, if the leading edge time of the output data signal corresponding to input data signal d0 110a is not at the desired time, it may be adjusted by changing the phase of the clock signal phi0_0 212_1. And, if the trailing edge time of the output data signal corresponding to input data signal d0 110a is not at the desired time, it may be adjusted by changing the phase of the clock signal phi3_0 212_4.

Figure 2B:
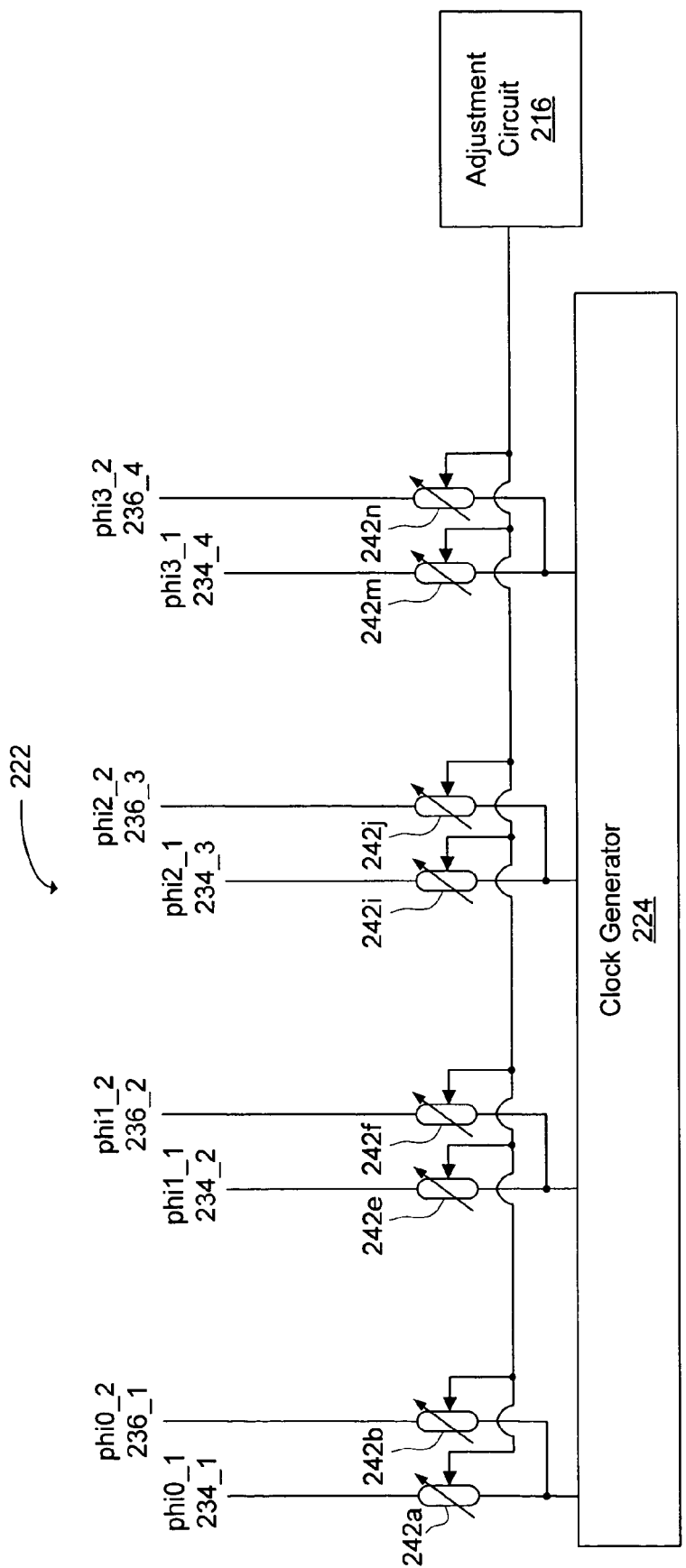
FIG. 2b is a block diagram of a circuit for adjusting clock signals in a data transmission circuit.
Figure 3B:
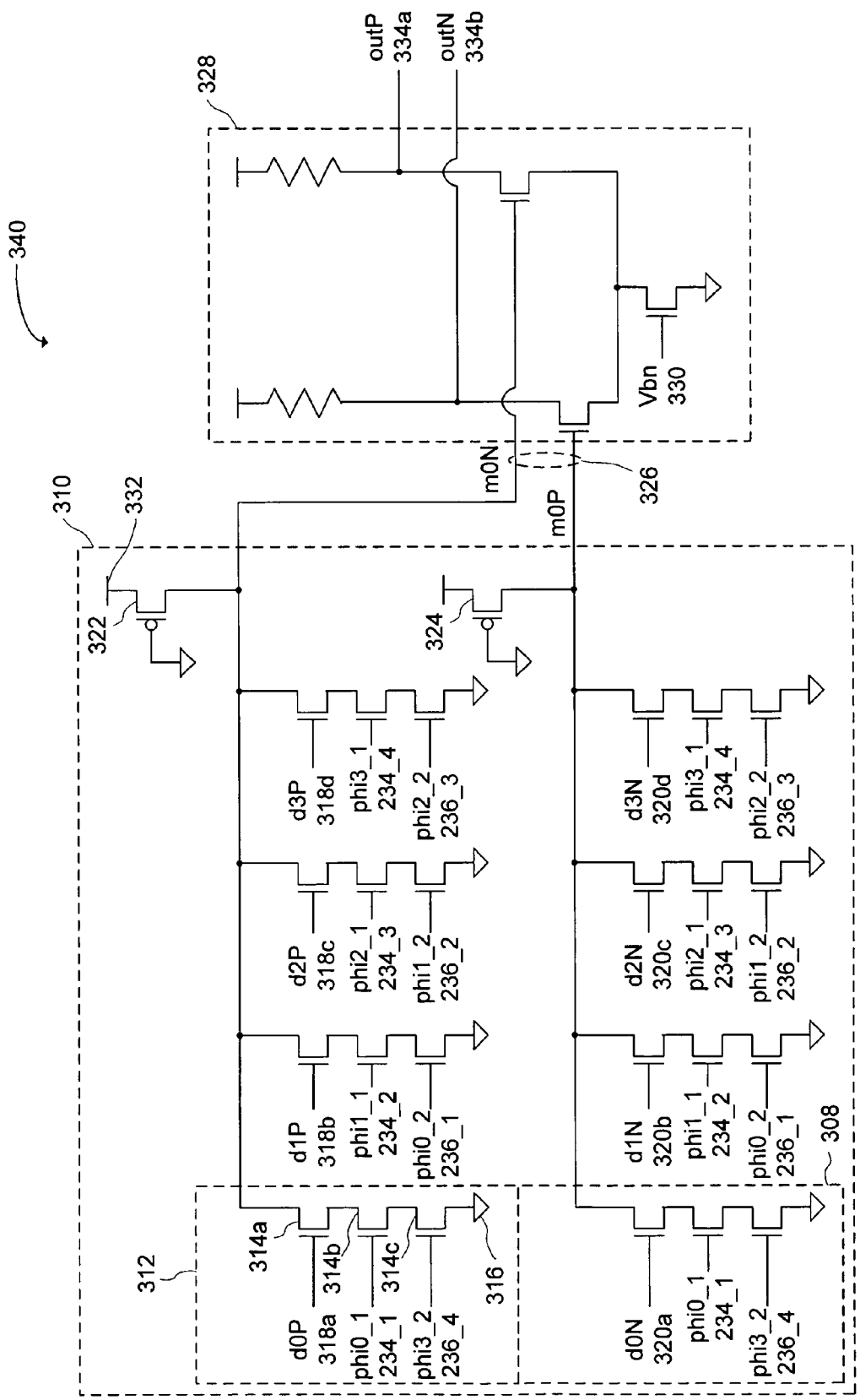
FIG. 3b is a block diagram illustrating a data transmission circuit.

In some embodiments, mismatches in the data transmission circuit 300 (FIG. 3a) may be reduced by using additional clock signals 212 for a respective number of input data signals 110. For example, eight clock signals 212 or sixteen clock signals 212 may be used with the four input data signals 110. FIG. 3b illustrates an embodiment of a data transmission circuit 340 having eight clock signals 234 and 236. Each column, such as a first column corresponding to NFET groups 308 and 312, has a respective pair of clock signals, such as clock signals 234_1 and 236_4 in the first column. In contrast with the data transmission circuit 300 (FIG. 3a), clock signals 234 and 236 in each column are different. Thus, the first column uses clock signal phi0_1 234_1 while a second column uses clock signal phi0_2 236_1. In this way, circuit mismatches between the various columns may be reduced by adjusting one or more phases of one or more clock signals 234 and 236. FIG. 2b illustrates an embodiment 222 of a clock generator 224 and phase adjustment circuits 242 for generating the clock signals 234 and 236. The phase adjusted clock generator 222 may be used in the data transmission circuit 340 (FIG. 3b).

Figure 2C:
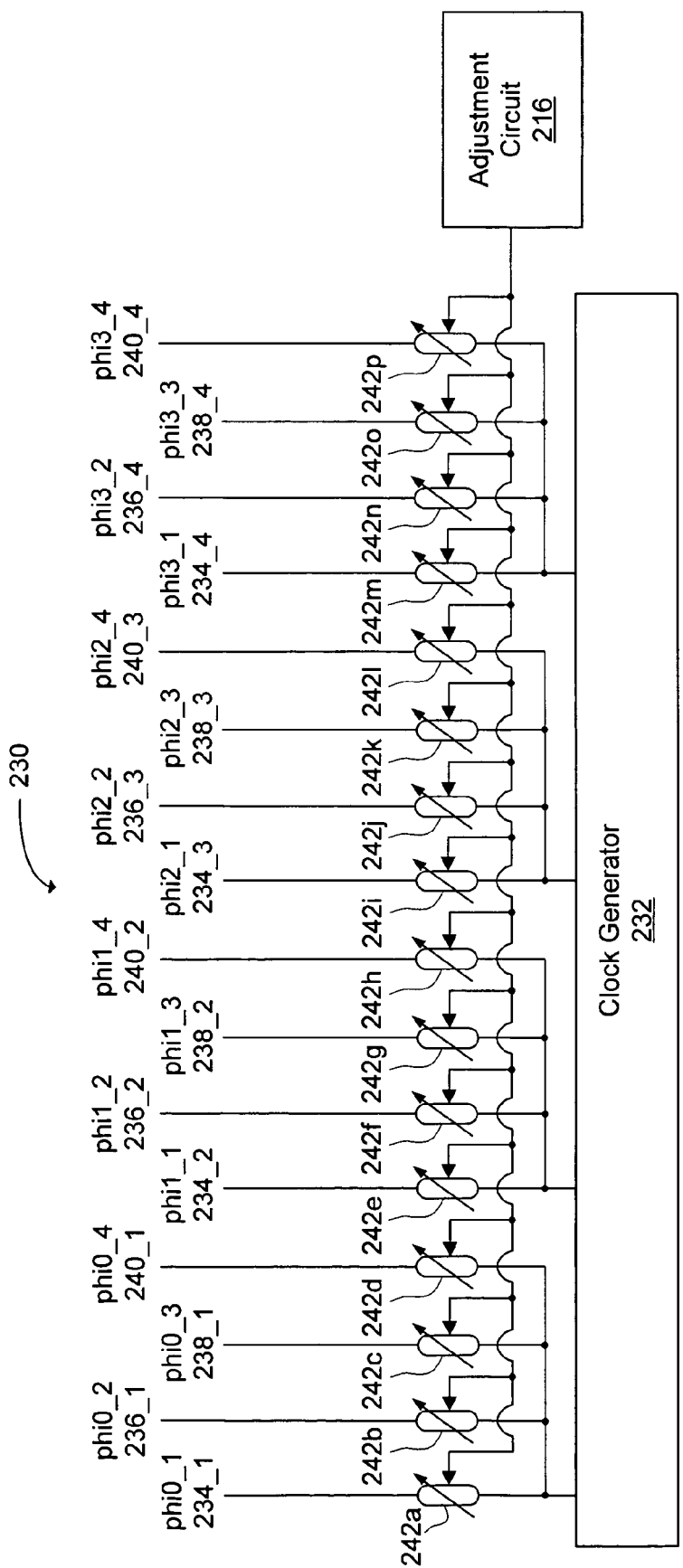
FIG. 2c is a block diagram of a circuit for adjusting of clock signals in a data transmission circuit.
Figure 3C:
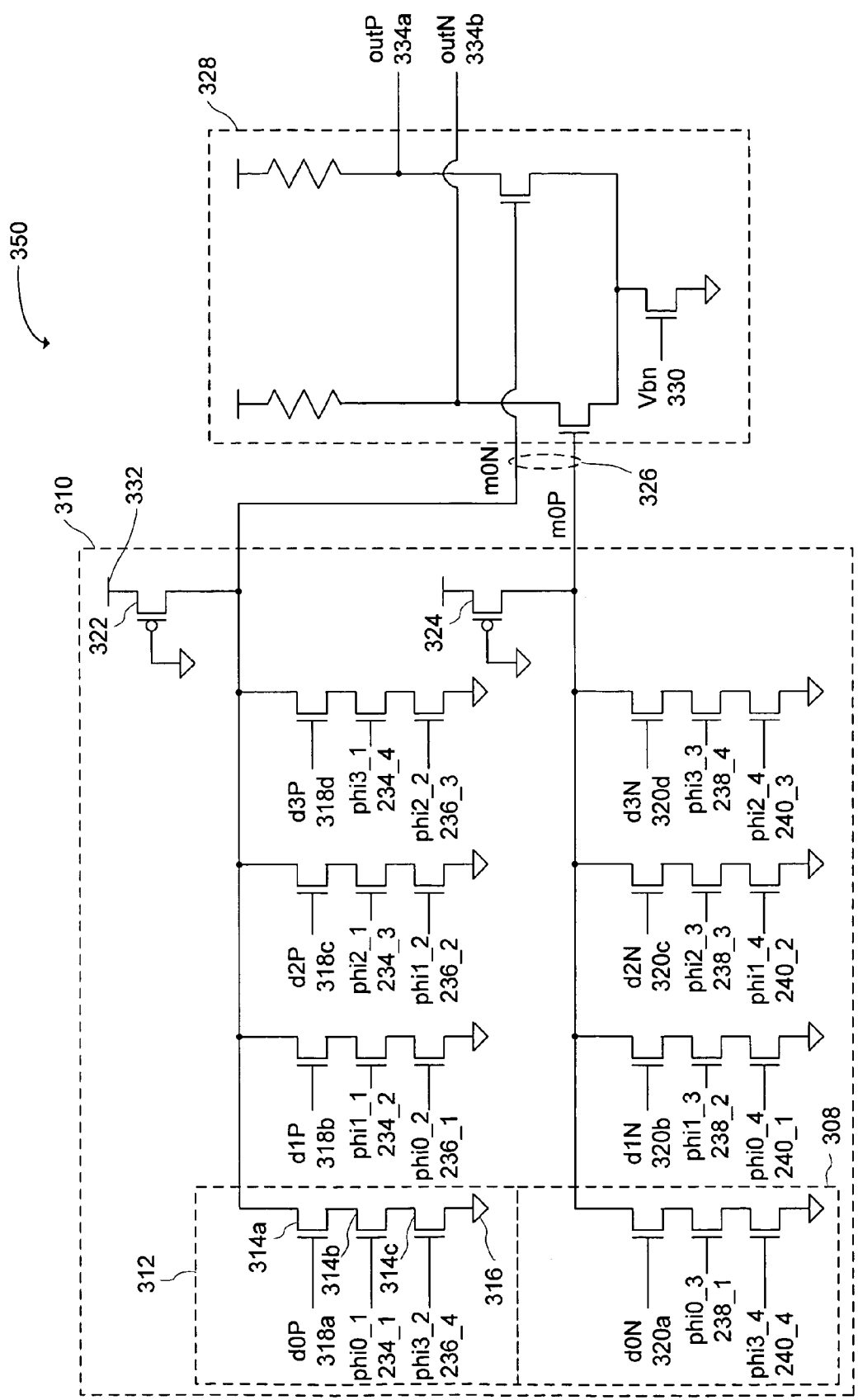
FIG. 3c is a block diagram illustrating a data transmission circuit.

FIG. 3c illustrates an embodiment of a data transmission circuit 350 having sixteen clock signals 234, 236, 238, and 240. Each row in each column, such as NFET group 312 in the first column, has a respective pair of clock signals, in this case clock signal phi0_1 234_1 and clock signal phi3_2 236_4. In contrast with the data transmission circuit 340 (FIG. 3b), the clock signals in a second row of each column are also different. Thus, NFET group 308 uses clock signal phi0_3 238_1 and clock signal phi3_4 240_4. In this way, circuit mismatches in the various columns, such as in the outputting of positive input data signal d0P 318a and negative input data signal d0N 320a, may be reduced by adjusting one or more phases of one or more of the clock signals 234_1, . . . 240_4. FIG. 2c illustrates an embodiment 230 of a clock generator 232 and phase adjustment circuits 242 for generating the clock signals 234, 236, 238 and 240. The phase adjusted clock generator 230 may be used in the data transmission circuit 350 (FIG. 3c).

Figure 5:
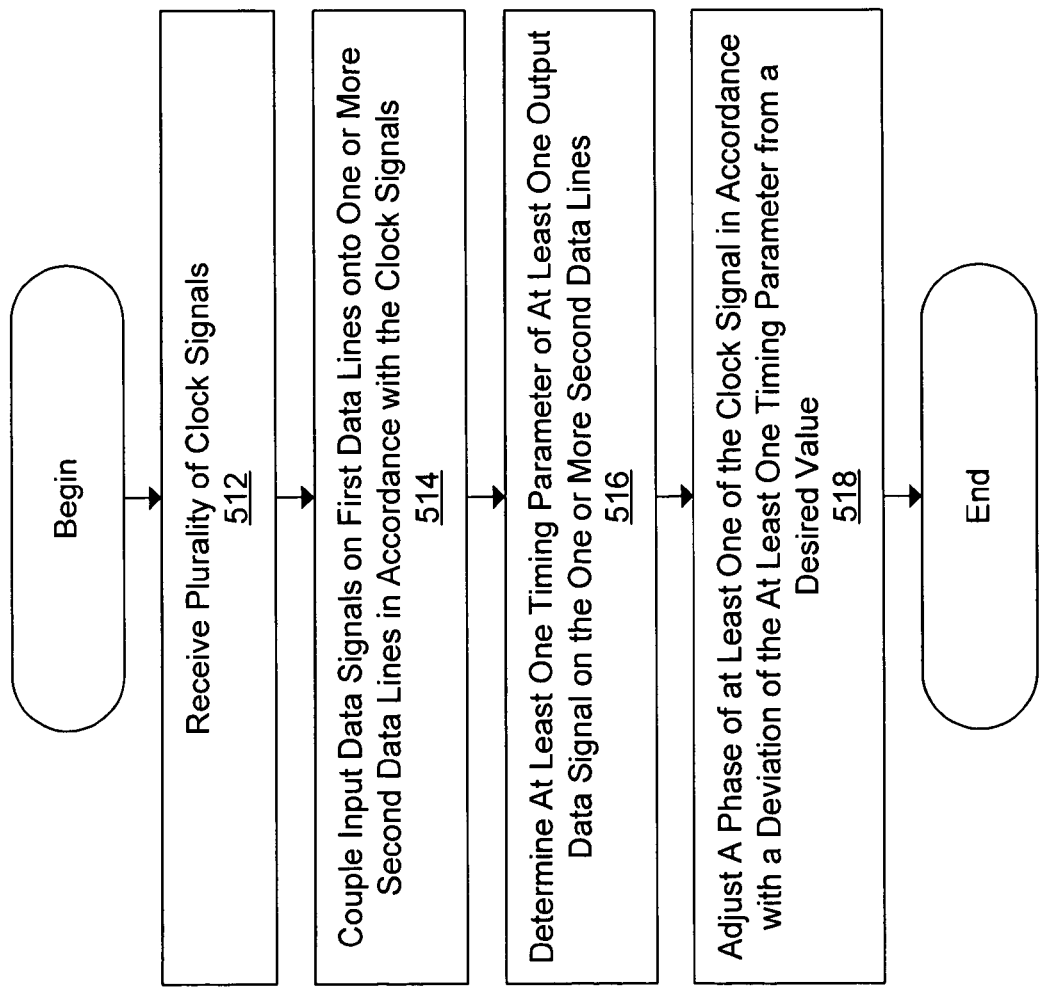
FIG. 5 is a flow diagram illustrating adjustment of clock signals during data transmission.

FIG. 5 shows a flow diagram illustrating an embodiment of a method or process for digital transmit phase trimming. After a plurality of clock signals are received 512, input data signals on first data lines are coupled onto one or more second data lines in accordance with the clock signals 514. At least one timing parameter, such as the edge time, for at least one output data signal on the one or more second data lines is determined 516. A phase of at least one of the clock signals is adjusted in accordance with a deviation of at least the one timing parameter from a desired value 518. At this point, the process may end, or it may be repeated. The process may be repeated until the measurements indicate that the clock signals meet predefined criteria, such as criteria with respect to the output data signals having substantially equal durations. In some embodiments, the order of these operations may be changed, one or more operations may be omitted and/or one or more operations may be repeated or iterated.

A variety of procedures may be used in adjusting one or more phases of the clock signals, such as clock signals 212 (FIG. 2a). For the data transmission circuit 200 (FIG. 2a) having four input data signals 110 (FIG. 2a) and four clock signals 212 (FIG. 2a), the timing-parameter-measurement-phase-adjustment problem may be expressed generally as a system of 4 equations with 4 unknowns, the unknowns being the phases of the clock signals. For embodiments of the data transmission circuit having more than one clock signal for a respective input data signal, such as data transmission circuit 340 (FIG. 3b) and data transmission circuit 350 (FIG. 3c), the system of equations may be modified, in these cases, to 8 equations with 8 unknowns or 16 equations with 16 unknowns, respectively.

Consider an example of the data transmission circuit having n input data signals and n clock signals. Define $X_{io}$ as an ideal duration of an i-th output data signal, i.e., a difference of a leading edge time and a trailing edge time. With n input data signals, $X_{io}=1/n$, for all i from 1 to n. Further define $X_{im}$ as a measured duration of the i-th output data signal and $\Delta i$ as a deviation of the phase of an i-th clock signal. The problem may be expressed as $$\begin{bmatrix} 1/n - X_{1m} \\ 1/n - X_{2m} \\ ... \\ 1/n - X_{nm} \end{bmatrix} = \begin{bmatrix} -1 & 1 & & \\ & -1 & 1 & \\ & & ... & \\ 1 & & & -1 \end{bmatrix} \begin{bmatrix} \Delta_1 \\ \Delta_2 \\ ... \\ \Delta_n \end{bmatrix} \quad (1)$$

where all the elements of the matrix on the right-hand side of the equal sign in Eqn. 1 that are not shown are equal to zero. This system of equations may be readily solved by inverting the matrix on the right-hand side of the equal sign in Eqn. 1 using techniques well known in the art. Solving these equations determines a set of $\Delta i$ values, the negatives of which correspond to a set of phase adjustments for "leveling" the clock signals.

Rather than solving such a system of equations, in many embodiments an iterative approach is used, where timing parameters such as edge times are measured, phase adjustments are determined using an adjustment circuit, such as the adjustment circuit 216 (FIG. 2a), and applied to the phase adjustment circuits, such as the phase adjustment circuits 210 (FIG. 2a), and the process is repeated. This approach may be implemented in a circuit and allows compensation for one or more non-linearities in one or more of the phase adjustment circuits and/or in one or more of the timing paths being compensated.

Figure 6:
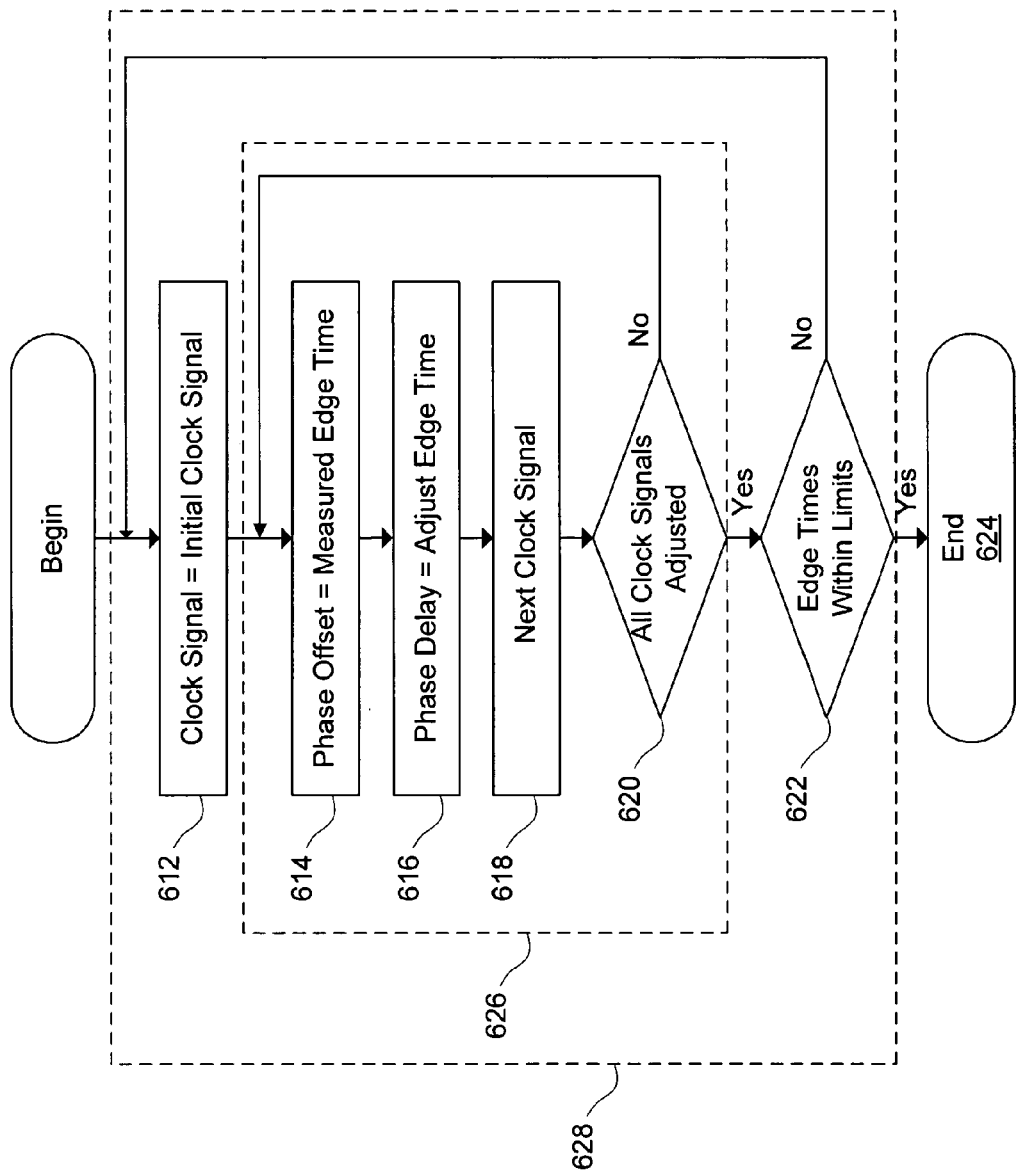
FIG. 6 is a flow diagram illustrating adjustment of clock signals during data transmission.

FIG. 6 shows an embodiment of such an iterative phase adjustment procedure. In this embodiment, the timing parameters that are measured are edge times. The procedure contains two loops. An inner loop 626 operates over a set of n clock phases and an outer loop 628 repeats the adjustment process until one or more edge times are within limits. After selecting an initial clock signal to be adjusted 612, a phase offset is determined from at least one measured edge time 614. A phase delay or clock signal phase of a respective phase adjustment circuit for the initial clock signal is determined so as to adjust the edge time 616. The next clock signal is selected 618. The inner loop 626 continues 620 until all the clock signals have been measured and, potentially, adjusted. The outer loop 628 determines if all of the edge times are within limits 622. If yes, the procedure ends 624. If no, the inner loop 626 repeats. In some embodiments, the order of these operations may be changed, one or more operations may be omitted and/or one or more operations may be repeated iterated. It may be noted that adjusting the edge time 616 may not be appropriate or possible in some cases for some clock signals, even though the duration of a corresponding data signal is not equal (within a predefined allowable margin) to its ideal value. In these cases, adjustment operation 616 is skipped. For instance, a phase adjustment circuit may be already set to its minimum phase adjustment value. In this case, decreasing the phase of a corresponding edge time is not physically possible, and therefore correction of a timing or duration mismatch will require adjustment of a different clock signal or edge time, for example by adjusting the phase delay of a "neighboring" clock signal or edge time. This is discussed in more detail, next.

In embodiments where the phase adjustment circuits, such as the phase adjustment circuits 210 (FIG. 2a), are only able to delay the phase of the clock signals, an adjustment procedure may determine the respective output data signal with the smallest duration. The leading edge time for this respective output data signal may be held constant and all remaining edge times may be adjusted, as necessary, relative to it. In other embodiments, the phase adjustment circuits may have an initial delay. This allows the phases of the clock signals to be adjusted such that they are early or late relative to initial phase values.

In some embodiments, the phase delays used for the respective output data signal in operation 616 may involve more than one clock signal. For example, for the respective output data signal having a duration that is greater than the desired duration, the phase delay of the clock signal corresponding to the leading edge time may be increased and the phase delay of the clock signal corresponding to the trailing edge time may be decreased. For the output data signal corresponding to input data signal d0 110a in FIG. 4, clock signal phi0_0 212_1 could be delayed and clock signal phi3_0 212_4 could be advanced. Alternatively, to compensate for an output data signal whose duration is shorter than the desired duration, the phase delay of the clock signal corresponding to the leading edge time may be decreased and the phase delay of the clock signal corresponding to the trailing edge time may be increased.

In some embodiments, the phase adjustment procedure may systematically increment one or more phase delays. In some embodiments, the phase adjustment procedure may use systematic under relaxation. In some embodiments, the phase adjustment procedure may perform a binary search.

In some embodiments, the phase adjustment procedure may converge faster by adjusting one or more phase delays by an amount proportional to a deviation of at least one edge time from the desired edge time. In some embodiments, a system of linear equations, such as Eqn. 1, may be solved for initial settings of the phase delays. These initial settings may be fine tuned in an iterative process to correct for non-linearities in the phase adjustment circuits and/or in the timing paths being compensated. This will also reduce the problem of adjustments to the edge time of a respective output data signal incorrectly adjusting the edge time of another output data signal.

In some embodiments, the phase adjustment procedure may also include a common-mode adjustment. If the phase delay for a respective clock signal reaches an end of an adjustment range for the corresponding phase adjustment circuit, or if a mean (common mode) of the phase delays is outside of a window, the common-mode of the phase delays may be re-centered by increasing or decreasing all of the phase delays, and thus all of the phase adjustment circuits.

Figure 7:
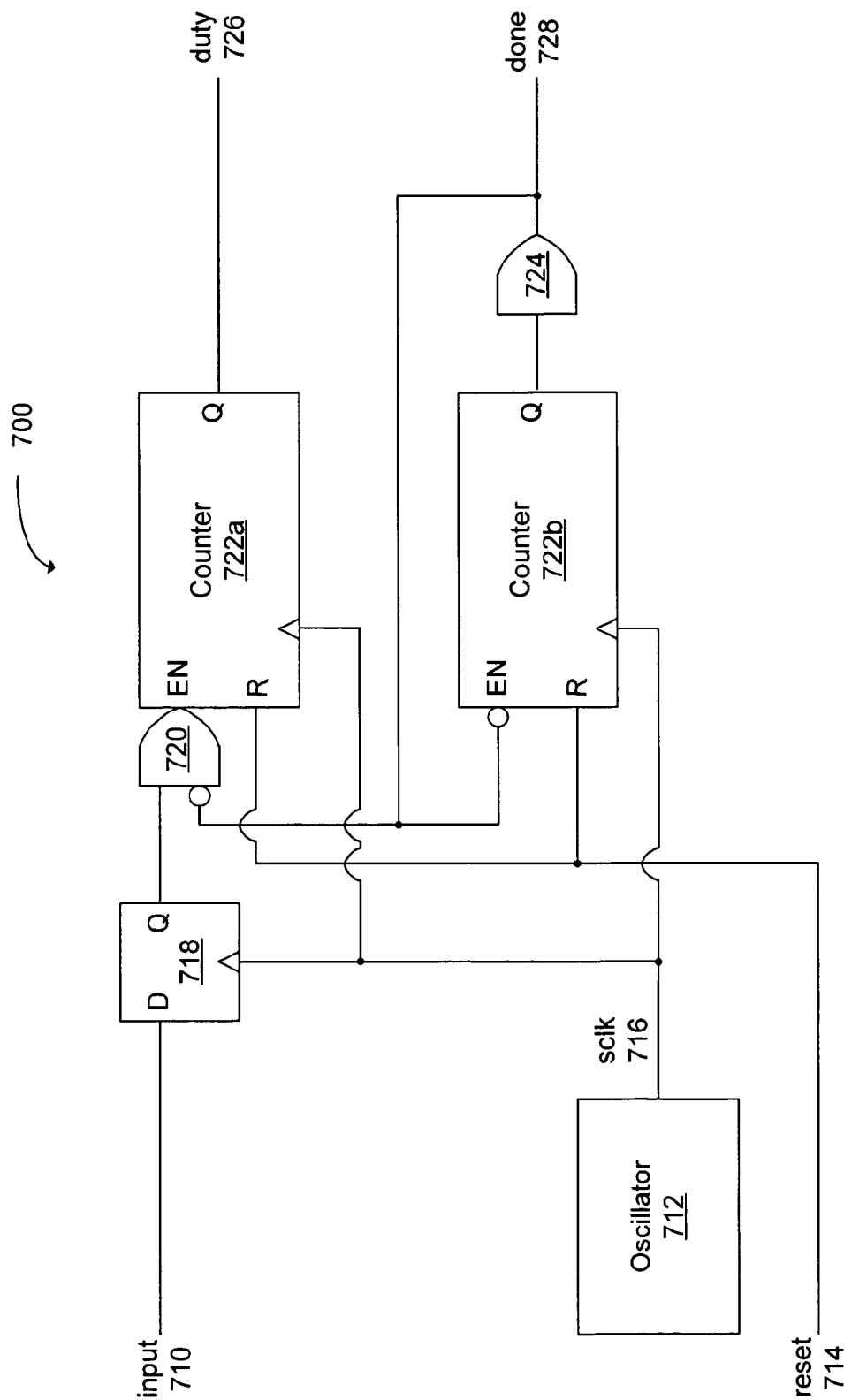
FIG. 7 is a block diagram illustrating determination of a duty cycle of an output data signal.

FIG. 7 illustrates an embodiment of a timing measurement circuit 700, such as the timing measurement circuit 214 (FIG. 2a). The timing measurement circuit 700 has an oscillator 712 generating sampling pulses sclk 716 that do not have a fixed phase relationship, i.e., are uncorrelated, with respect to the clock signals, such as clock signals 212 (FIG. 2a), used in data transmission circuits, such as the data transmission circuit 200 (FIG. 2a). Since the relative phase will vary over time, the timing measurement circuit 700 will randomly sample, using flip flop 718, one or more output data signals that are coupled to input 710. As a consequence, during operation of the timing measurement circuit 700 a test pattern or training sequence with an isolated logical 1 or logical 0, e.g., 0100 or 1011, is used as an input data signal to the multiplexer, such as multiplexer 116 (FIG. 2a). Each training sequence can be thought of as contributing one row to equation (1). Training sequences need not be restricted to isolated 1s and 0s. Any set of training sequences that admits unique solution to the system of equations is acceptable.

At the beginning of a sampling interval for the timing measurement circuit 700, counters 722 are reset 714 and the training sequence is applied to the input 710. As noted in the preceding paragraph, the input 710 is randomly sampled. A total number of samples is counted by counter 722b while a number of samples where the input 710 was a logical 1 are counted by counter 722a using AND gate 720. The sample interval ends when the counter 722b reaches its terminal count (all logical 1s on its output Q). At this point, done 728, an output of AND gate 724, goes high, disabling both counters 722 and signaling the completion of the measurement to the adjustment circuit, such as the adjustment circuit 216 (FIG. 2a). In some embodiments, done 728 may also stop the oscillator 712 In some embodiments, an equality comparator my replace AND gate 724 to allow the counters to be stopped at an arbitrary terminal count (i.e., at any binary value, not just all 1s). The adjustment circuit then reads duty 726, which is an output Q of the counter 722a, and reflects the corresponding timing parameter, a duty factor (a relative duration of the isolated logical 0 or isolated logical 1) of the test sequence as a ratio relative to the terminal count of the counter 722b. The absolute duration, such as the duration 420 (FIG. 4), is this duty factor multiplied by a period of the respective clock signal, such as clock signal phi0_0 212_1 (FIG. 2a).

For example, consider a measurement where the input training sequence is 1000, i.e., the input 710 is high from clock signal phi0_0 212_1 (FIG. 2a) high to clock signal phi3_0 212_4 (FIG. 2a) low. The resulting duration 420 (FIG. 4) is nominally 200 ps. In addition, the counters 722 have 12 bits. When counter 722b reaches its terminal count of 4095, say counter 722a has a count of 1277. The duty factor of is thus 1277 divided by 4095 or 0.3118. The duration is 0.3118 times 800 ps or 249.5 ps. A similar measurement may be performed with the training sequence 1011 to determine the duration of a zero pulse. The two duration measurements may be averaged. While the example here is illustrated with 12 bits, counters 722 with different number of bits may be used. Counters 722 with more bits offer greater precision at the expense of a longer measurement time or sample interval.

The oscillator 712 may be any source of pulses. It need not be periodic. The pulses should, however, be uncorrelated with the respective clock signal. In one embodiment, oscillator 712 is a ring oscillator constructed from CMOS inverters with a nominal frequency slightly higher than (but not a rational multiple of) the respective clock signal. In some embodiments, the ring oscillator may be stopped when done 728 is asserted by replacing one inverter in the oscillator 712 with a NOR gate having one input connected to done 728. To avoid a coincidental correlation with the respective clock signal, the number of inverters in the ring oscillator may be adjustable, for example, by switching an even number of inverters in or out under external logical control.

Figure 8:
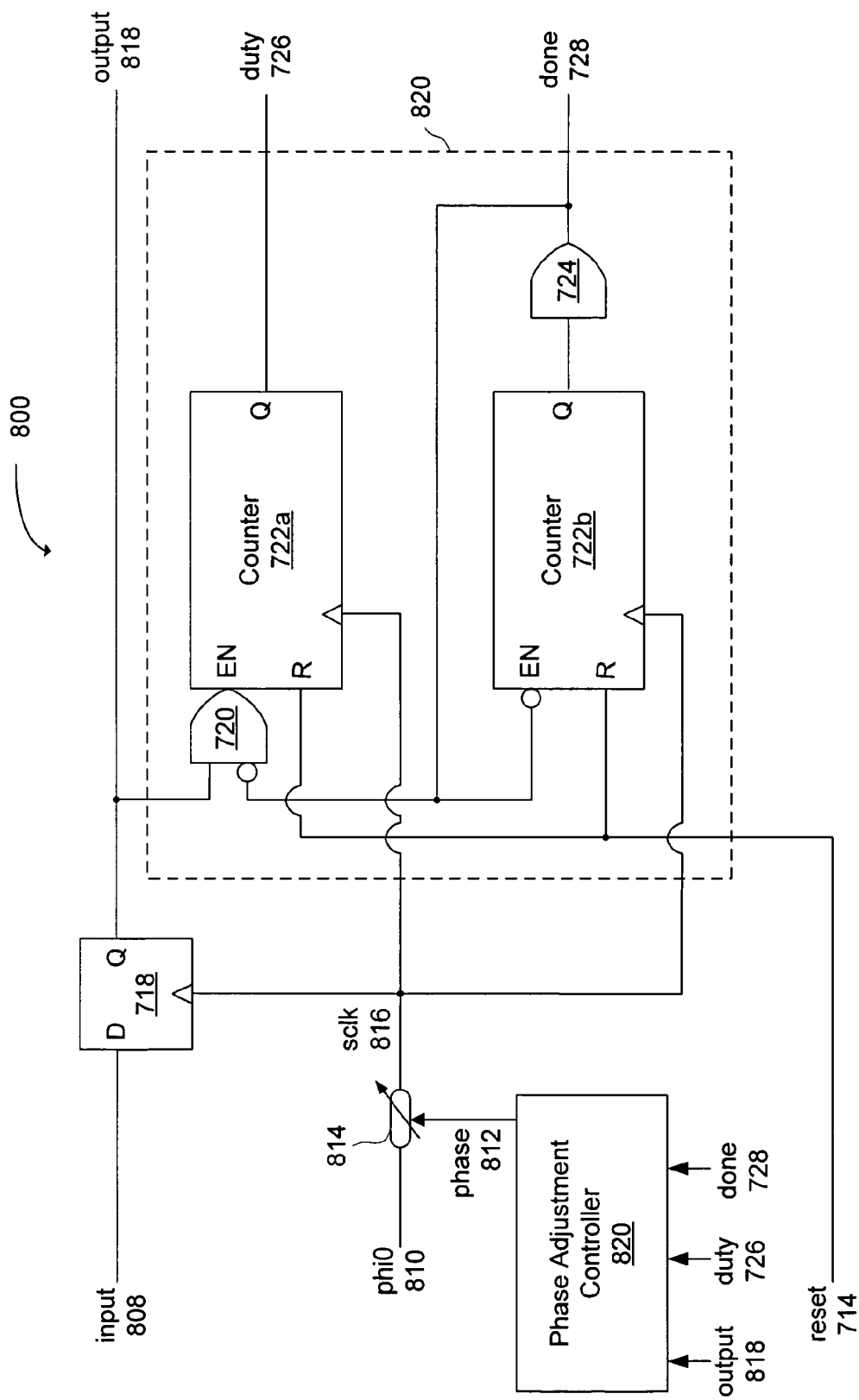
FIG. 8 is a block diagram illustrating determination of an edge time in an output data signal.

While the timing measurement circuit 700 gives a high-precision measurement, the measurement may take considerable time and it requires that a training sequence be transmitted during a training mode of operation. FIG. 8 illustrates an embodiment of a timing measurement circuit 800 that reduces a measurement time considerably. However, a training sequence is still necessary. The timing measurement circuit 800 uses a delayed clock signal sclk 816, corresponding to clock signal phi0 810, as the sample clock instead of the oscillator 712 (FIG. 7). A delay of the delayed clock signal sclk 816 is controlled by phase adjustment circuit 814. The phase adjustment circuit is set using a control signal, phase 812.

In some embodiments, the timing measurement circuit 800 may determine at least the one timing parameter, a leading or a trailing edge time, of the respective output data signal using a binary search. For example, to determine the phase of clock signal phi0 810, a training sequence of 1110 is transmitted, and phase 812 is initially set to half its range, for example, a value of 512 out of a range of 1024. Output 818 indicates if the sampling is before (logical 0) or after (logical 1) the leading edge of the respective output data signal. The range of possible phase values is then divided in two and phase 812 is once again set to the middle of the feasible range. The process continues until the exact phase 812 at which the logical 0-1 transition takes place in the respective output data signal is located. This sequence of operations may be controlled by a phase adjustment controller 820, which may be implemented as a finite state machine, or as a programmed processor.

As the binary search closes in on the correct phase and flip-flop 718 starts sampling near the edge time, the output 818 will start to vary due to jitter. That is, for the same value of phase 812 some samples will be a logical 0 and some will be a logical 1 due to cycle-to-cycle variations in the timing of both the input data signal 808 and the clock signal phi0 810. To perform a precise measurement in the presence of this jitter, the duty factor of the sample may be measured using the counters 722 in the timing measurement circuit 800. The exact position of the edge time is determined when the phase 812 results in the duty 726 that is half of the terminal value of counter 722b. The duty factor measurement is only necessary during the final steps of the binary search and a relatively small number of bits (e.g., 6 bits) suffices to give adequate precision. As a consequence, the timing measurement and the adjustment of the clock phase are very fast.

Nonlinearities in the phase adjustment circuit 814 may affect the accuracy of measurements performed with the timing measurement circuit 800. Non-linearities may be compensated for by calibrating the phase adjustment circuit 814 by measuring the duty factor of a signal that is set high when clock signal phi0 810 is rising and that is cleared by delayed clock signal sck 816 rising. The phase adjustment controller 820, which controls the operation of circuit 800, performs the binary search as described above, but substitutes a calibrated value for the final phase after the search is completed.

Figure 9:
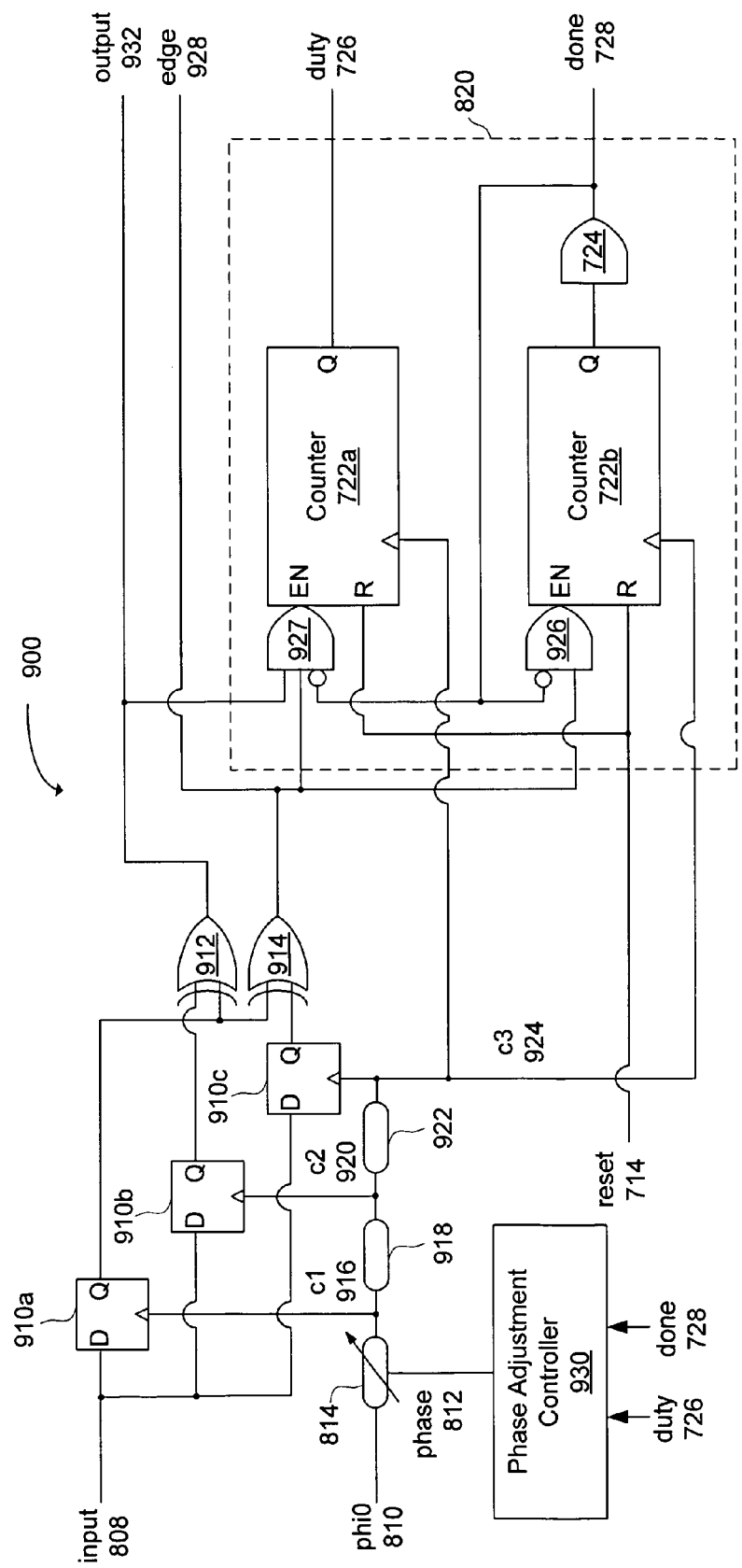
FIG. 9 is a block diagram illustrating determination of an edge time in an output data signal.

Timing measurement circuit 700 and timing measurement circuit 800 have the limitation that a training sequence must be transmitted during a training mode of operation in order to perform the measurements. FIG. 9 illustrates an embodiment of a timing measurement circuit 900 that overcomes this limitation and enables measurements to be performed while the data transmission circuit, such as the data transmission circuit 200 (FIG. 2a), is operating normally, i.e., transmitting user data. The timing measurement circuit 900, therefore, may perform one or more measurements during a normal mode of operation of the data transmission circuit, such as the data transmission circuit 200 (FIG. 2a). In some embodiments, the timing measurement circuit 900 performs measurements continuously.

The timing measurement circuit 900 includes a phase adjustment circuit 814 and two fixed delay elements 918 and 922 to generate three clock signals c1 916, c2 920 and c3 924, respectively. These clock signals have transitions separated by a half of the bit time. That is, fixed delay elements 918 and 922 have a delay that is nominally one half of the input bit time of the input data signal. The effect is to capture three samples of the input 808 in flip flops 910. The first sample (in flip flop 910a) is captured half of an input bit time before a phase boundary in the respective output data signal, the middle sample (in flip flop 910b) is a sample at the phase boundary, and the last sample (in flip flop 910c) is captured half of an input bit time after the phase boundary. The phase adjustment circuit 814 sets the phase boundary. If it is adjusted such that the middle sample is near the phase boundary, flip flops 910a and 910c sample before and after the phase boundary respectively and flip flop 910b samples the input 808 at the phase boundary. If there is an input transition (herein called an edge) at the phase boundary, samples in flip flops 910a and 910c will be different and hence edge 928 will be asserted by XOR gate 914. When the input signal contains an edge, output 932 from XOR gate 912 will be logical true if the sampling time of clock signal c2 920 is late, i.e., if an output from flip-flop 910b differs from an output of flip flop 910a. At each position of the phase boundary, the counters 722 are used to count the fraction of edge sampling times, at least the one timing parameter in this embodiment, that are late. In particular, counter 722b counts the total number of edges, while counter 722a counts the number of late sampled edges. Gate 926 enables counter 722b when edge 928 is true and the counter 722b has not reached its maximum value. Gate 927, the output of which enables counter 722a, logically ANDs the output 932 and edge 928 signals, because the output 932 is valid (i.e., for enabling the counter 722a) only when the edge 928 is asserted. If there is no change in the input 808 between the first and the last sampling points in the flip flops 910, there is no edge time to compare with the current setting of the phase boundary.

In some embodiments, the timing measurement circuit 900 is used in a manner similar to the timing measurement circuit 800 (FIG. 8). A binary search may be performed for the respective edge time by adjusting phase adjustment circuit 814 using a binary search pattern under the control of a phase adjustment controller 930. No training sequence is necessary because logical 0-1 and logical 1-0 transitions in the data signal coupled to the input 808 are used to perform the measurement. In addition, output 932 is only valid if edge 928 is asserted.

In some embodiments, the timing measurement circuit 900 may be adapted to separately measure rising and falling edges. To measure rising edges, XOR gate 914 is replaced by an AND gate that ANDs the complement of the output of 910a and the output of 910c. To measure falling edges, the AND gate ANDs the output of 910a with the complement of the output of 910c. One skilled in the art will understand that a circuit that can select either rising or falling edges can be built using an AND gate and two XOR gates.

In some embodiments, measurements without a training sequence may also be performed by coupling the timing measurement circuit 700 or the timing measurement circuit 800 to one or more of the clock signals, such as the clock signals 212 (FIG. 2a). In this way, the clock signal phases may be measured at the point the clock signals are connected to the multiplexer, such as the multiplexer 116 (FIG. 2a).

In some embodiments, phase delays or clock signal phases may be set in order to reduce mismatches in the data transmission circuit. Additional phase adjustments may be performed to reduce mismatches associated with thermal effects. In some embodiments, such phase adjustments may be performed after the data transmission circuit is coupled to a power supply. In other embodiments, phase adjustments to reduce thermally induced mismatches may be performed at periodic intervals, as necessary or continuously. Measurements of differences between one or more timing parameters, such as one or more edge times, in one or more output data signals, and one or more desired values, such as one or more desired edges times, may be used to determine if and when additional phase adjustments to reduce mismatches associated with thermal effects may be performed.

Devices and circuits described herein can be implemented using computer aided design tools available in the art, and embodied by computer readable files containing software descriptions of such circuits, at behavioral, register transfer, logic component, transistor and layout geometry level descriptions stored on storage media Data formats in which such descriptions can be implemented include, but are not limited to, formats supporting behavioral languages like C, formats supporting register transfer level RTL languages like Verilog and VHDL, and formats supporting geometry description languages like GDSII, GDSIII, GDSIV, CIF, MEBES and other suitable formats and languages. Physical files can be implemented on machine readable media such as 4 mm magnetic tape, 8 mm magnetic tape, 3½ inch floppy media, CDs, DVDs and SO on.

In an embodiment of the present invention, as described above, the invention comprises a circuit that includes a first phase adjustment circuit and a second phase adjustment circuit. The circuit is for generating a plurality of output data signals on at least one output data line at times controlled by a plurality of clock signals. The first phase adjustment circuit and the second phase adjustment circuit are each coupled to at least one of the plurality of clock signals, wherein the first phase adjustment circuit adjusts a first edge time of a respective output data signal and the second phase adjustment circuit adjusts a second edge time of the respective output data signal. The adjustments of the first edge time and the second edge time are in accordance with phase adjustments to at least two of the clock signals.

In some embodiments of the aforementioned circuit, the first edge time and the second edge time are selected from the group consisting of a leading edge time and a trailing edge time.

In some embodiments of the aforementioned circuit, the first edge time and the second edge time are selected from the group consisting of a rising edge time and a falling edge time.

In some embodiments of the aforementioned circuit, the first phase adjustment circuit and the second phase adjustment circuit adjust phases of the clock signals.

In some embodiments of the aforementioned circuit, the clock signals are generated by a clock circuit having a single oscillator.

In some embodiments of the aforementioned circuit, the first phase adjustment circuit and the second phase adjustment circuit are selected from the group consisting of phase locked loops, delay locked loops, analog delay lines and digital delay lines.

In some embodiments of the aforementioned circuit, the respective output data signal is a digital signal.

In some embodiments of the aforementioned circuit, the circuit includes a multiplexer and a timing measurement circuit. The multiplexer couples input data signals on a plurality of first data lines onto at least the one output data line in accordance with the clock signals. The timing measurement circuit determines at least the first edge time of at least the respective output data signal on at least the one output data line and generates a control signal to adjust at least one of the first phase adjustment circuit and the second phase adjustment circuit in accordance with a deviation of at least the first edge time from at least a desired first edge time.

In some embodiments of the aforementioned circuit, the timing measurement circuit includes at least one output transmission driver circuit coupled to the multiplexer. The transmission driver circuits generate output data signals on at least the one output data line.

In some embodiments of the aforementioned circuit, the timing measurement circuit comprises an analog measurement circuit.

In some embodiments of the aforementioned circuit, the timing measurement circuit comprises a digital measurement circuit.

In some embodiments of the aforementioned circuit, at least the first edge time of the respective output data signal is determined, in one mode of operation, using input data signals corresponding to at least one training sequence.

In some embodiments of the aforementioned circuit, at least the first edge time of the respective output data signal is determined during a normal mode of operation.

In some embodiments of the aforementioned circuit, at least the first edge time of the respective output data signal is determined continuously during operation of the circuit.

In some embodiments of the aforementioned circuit, the timing measurement circuit includes at least two counters gated by a measurement clock signal whose phase varies relative to at least one of the clock signals. The timing measurement circuit determines a duty cycle of the respective output data signal using input data signals corresponding to at least one training sequence.

In some embodiments of the aforementioned circuit, the timing measurement circuit includes at least two counters gated by a measurement clock signal having an adjustable phase relative to at least one of the clock signals. The timing measurement circuit determines at least one edge time in the respective output data signal, the edge time selected from the group consisting of a rising edge and a falling edge.

In an embodiment of the present invention, as described above, the invention comprises a method including coupling input data signals on a plurality of first data lines onto at least one second data line in accordance with a plurality of clock signals, determining at least one timing parameter of at least one output data signal on at least the one second data line and adjusting at least one of the clock signals in accordance with a deviation of at least the one timing parameter from a desired value.

In some embodiments of the aforementioned method, at least the one timing parameter is selected from the group consisting of a leading edge time and a trailing edge time.

In some embodiments of the aforementioned method, at least the one timing parameter is selected from the group consisting of a rising edge time and a falling edge time.

In some embodiments of the aforementioned method, at least the one timing parameter comprises a duration of at least the one output data signal.

In some embodiments of the aforementioned method, the output data signal is a digital signal.

In some embodiments of the aforementioned method, the method further includes generating the clock signals.

In some embodiments of the aforementioned method, determining at least the one timing parameter of at least the one output data signal is performed using an analog measurement circuit.

In some embodiments of the aforementioned method, determining at least the one timing parameter of at least the one output data signal is performed using a digital measurement circuit.

In some embodiments of the aforementioned method, determining of at least the one timing parameter of at least the one output data signal, in one mode of operation, uses input data signals corresponding to at least one training sequence.

In some embodiments of the aforementioned method, determining at least the one timing parameter of at least the one output data signal occurs during a normal mode of operation.

In some embodiments of the aforementioned method, determining at least the one timing parameter of at least the one output data signal occurs continuously.

In some embodiments of the aforementioned method, adjusting at least the one of the clock signals adjusts at least the one timing parameter of the output data signal selected from the group consisting of a leading edge time and a trailing edge time.

In some embodiments of the aforementioned method, adjusting at least the clock signal adjusts a leading edge time and a trailing edge time of the output data signal.

In some embodiments of the aforementioned method, determining at least the one timing parameter includes at least two counting operations gated by a measurement clock signal whose phase varies relative to at least one of the clock signals. The two counting operations determine a duty cycle of at least the one output data signal using input data signals corresponding to at least one training sequence.

In some embodiments of the aforementioned method, determining at least the one timing parameter includes at least two counting operations gated by a measurement clock signal having an adjustable phase relative to at least one of the clock signals. The two counting operations determine at least the one timing parameter in at least the one output data signal, at least the one timing parameter selected from the group consisting of a rising edge and a falling edge.

In some embodiments of the aforementioned method, at least the one timing parameter is determined by adjusting the adjustable phase using a binary search.

In an embodiment of the present invention, as described above, the invention comprises a method including coupling input data signals on a plurality of first data lines onto at least one second data line in accordance with a plurality of clock signals and adjusting a first edge time and a second edge time of a respective output data signal in accordance with phase adjustments of at least two of the clock signals.

The foregoing descriptions of specific embodiments of the present embodiments are presented for purposes of illustration and description. They are not intended to be exhaustive or to limit the invention to the precise forms disclosed. Rather, it should be appreciated that many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A circuit, comprising:
   a multiplexer to receive input data signals on a plurality of first data lines and to output onto at least one second data line output data signals with transmit timing determined in accordance with a plurality of clock signals, the clock signals including an adjusted clock signal;
   a timing measurement circuit to:
      determine at least one timing parameter of at least one output data signal on at least the one second data line, and
      generate a control signal in accordance with a deviation of at least the one timing parameter from a desired value; and a phase adjustment circuit to adjust transmission of the at least one output data signal including adjusting a first clock signal of the plurality of clock signals in accordance with the control signal to generate the adjusted clock signal.

2. The circuit of claim 1, wherein the timing measurement circuit determines a leading edge time and a trailing edge time corresponding to a duration of at least the one output data signal and the desired value is a desired edge time.

3. The circuit of claim 1, wherein at least the one timing parameter is selected from the group consisting of a leading edge time and a trailing edge time and the desired value is a desired edge time.

4. The circuit of claim 1, wherein the output data signals are digital signals.

5. The circuit of claim 1, wherein the first clock signal is generated by a clock circuit having a single oscillator.

6. The circuit of claim 1, further comprising at least one output transmission driver circuit coupled to the multiplexer, wherein at least the one transmission driver circuit generates output data signals on at least the one second data line.

7. The circuit of claim 1, wherein the timing measurement circuit comprises an analog measurement circuit.

8. The circuit of claim 1, wherein the timing measurement circuit comprises a digital measurement circuit.

9. The circuit of claim 1, wherein in one mode of operation at least the one timing parameter of at least the one output data signal is determined using input data signals corresponding to at least one training sequence.

10. The circuit of claim 1, wherein at least the one timing parameter of at least the one output data signal is determined during a normal mode of operation.

11. The circuit of claim 1, wherein at least the one timing parameter of at least the one output data signal is determined continuously during operation of the circuit.

12. The circuit of claim 1, wherein the phase adjustment circuit is selected from the group consisting of phase locked loops, delay locked loops, analog delay lines and digital delay lines.

13. The circuit of claim 1, wherein adjustment of the first clock signal adjusts at least the one timing parameter of the output data signals selected from the group consisting of a leading edge time and a trailing edge time.

14. The circuit of claim 1, wherein adjustment of the first clock signal adjusts a leading edge time and a trailing edge time of the output data signals.

15. The circuit of claim 1, wherein the timing measurement circuit includes at least two counters gated by a clock signal whose phase varies relative to at least one of the plurality of clock signals, the timing measurement circuit determining a duty cycle of at least the one output data signal using input data signals corresponding to at least one training sequence.

16. The circuit of claim 1, wherein the timing measurement circuit includes at least two counters gated by a clock signal having an adjustable phase relative to at least one of the plurality of clock signals, the timing measurement circuit determining at least one timing parameter in at least the one output data signal, the timing parameter selected from the group consisting of a rising edge time and a falling edge time.

17. The circuit of claim 1, wherein the timing parameter is at least one of a pulse duration and an edge time.

18. The circuit of claim 1, wherein the phase adjustment circuit regulates a duty cycle of the output data signals on the at least one second data line by adjusting the first clock signal of the plurality of clock signals in accordance with the control signal.

19. A method, comprising:
using a multiplexer, coupling input data signals on a plurality of first data lines onto at least one second data line with transmit timing determined in accordance with a plurality of clock signals;
determining at least one timing parameter of at least one output data signal on at least the one second data line; and
adjusting transmission of the at least one output data signal including adjusting at least one of the clock signals in accordance with a deviation of at least the one timing parameter from a desired value.

20. The method of claim 19, wherein the timing parameter is at least one of a pulse duration and an edge time.

21. The method of claim 19, wherein the adjusting regulates a duty cycle of the at least one output data signal on the at least one second data line by adjusting one or more of the plurality of clock signals in accordance with the deviation of the at least one timing parameter from the desired value.

22. A circuit, comprising:
a multiplexer means to receive input data signals on a plurality of first data lines and to output onto at least one second data line output data signals with transmit timing determined in accordance with a plurality of clock signals, the clock signals including an adjusted clock signal; and
a timing measurement means:
to determine at least one timing parameter of at least one output data signal on at least the one second data line and
to generate a control signal in accordance with a deviation of at least the one timing parameter from a desired value; and
a phase adjustment means to adjust transmission of the at least one output data signal including adjusting a first clock signal of the plurality of clock signals in accordance with the control signal to generate the adjusted clock signal.

23. The circuit of claim 22, wherein the timing parameter is at least one of a pulse duration and an edge time.

24. The circuit of claim 22, wherein the phase adjustment means regulates a duty cycle of the output data signals on the at least one second data line by adjusting the first clock signal of the plurality of clock signals in accordance with the control signal.

25. A computer readable storage medium containing data representing a circuit that includes:
a multiplexer to receive input data signals on a plurality of first data lines and to output onto at least one second data line output data signals with transmit timing determined in accordance with a plurality of clock signals, the clock signals including an adjusted clock signal; and
a timing measurement circuit:
to determine at least one timing parameter of at least one output data signal on at least the one second data line and
to generate a control signal in accordance with a deviation of at least the one timing parameter from a desired value; and
a phase adjustment circuit to adjust transmission of the at least one output data signal including adjusting a first clock signal of the plurality of clock signals in accordance with the control signal to generate the adjusted clock signal.

* * * * *

UNITED STATES PATENT AND TRADEMARK OFFICE
CERTIFICATE OF CORRECTION

| | |
|---|---|
| PATENT NO. | : 7,627,069 B2 |
| APPLICATION NO. | : 11/046451 |
| DATED | : December 1, 2009 |
| INVENTOR(S) | : William J. Dally |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1202 days.

Signed and Sealed this

Second Day of November, 2010

David J. Kappos
*Director of the United States Patent and Trademark Office*